United States Patent [19]

Takaya et al.

[11] Patent Number: 4,606,985
[45] Date of Patent: Aug. 19, 1986

[54] LITHOGRAPHIC PRINTING PLATES

[75] Inventors: Yoshikazu Takaya; Yasuo Tsubai; Hiroshi Nishinoiri, all of Nagaokakyo, Japan

[73] Assignee: Mitsubishi Paper Mills, Ltd., Tokyo, Japan

[21] Appl. No.: 412,207

[22] Filed: Aug. 27, 1982

[30] Foreign Application Priority Data

Sep. 2, 1981 [JP] Japan ................. 56-138249

[51] Int. Cl.[4] .......... G03C 5/54; G03C 1/30; G03C 1/04; G03F 7/06
[52] U.S. Cl. .................... 430/14; 101/453; 101/464; 430/18; 430/204; 430/264; 430/302; 430/232; 430/642
[58] Field of Search ............ 430/204, 205, 264, 302, 430/232, 642, 14, 18; 101/453, 464

[56] References Cited

U.S. PATENT DOCUMENTS

| 3,454,398 | 7/1969 | Wendt | 430/302 |
| 3,721,559 | 3/1973 | DeHaes et al. | 430/204 |
| 3,764,323 | 10/1973 | Strem et al. | 430/302 |
| 4,230,792 | 10/1980 | Tsubai et al. | 430/302 |
| 4,360,590 | 11/1982 | Tomka | 430/642 |
| 4,361,639 | 11/1982 | Kanada et al. | 430/204 |

*Primary Examiner*—Richard L. Schilling
*Attorney, Agent, or Firm*—Cushman, Darby & Cushman

[57] ABSTRACT

Lithographic printing plates which have on a support at least one hardened gelatin-containing layer which contains a photographic gelatin and a low molecular-weight gelatin are improved in printing endurance, e.g., resistances against ink-staining and blinding of image areas.

8 Claims, No Drawings

LITHOGRAPHIC PRINTING PLATES

BACKGROUND OF THE INVENTION

This invention relates to a lithographic printing plate and a process for the preparation thereof. More particularly, it relates to a process for preparing a lithographic printing plate by utilizing a photosensitive silver halide emulsion.

The lithographic printing plate comprises lipophilic image areas receptive to a greasy ink and lipophobic non-image areas non-receptive to the ink, said non-image areas being generally made hydrophilic to receive water. The common lithographic printing, therefore, is performed by feeding both ink and water to the printing plate surface to allow the image areas to selectively receive the coloring ink and the non-image areas to selectively receive water, and transferring the ink on the image areas to a substrate material such as, for example, paper. In order to produce good prints, it is necessary that difference between the lipophilicity and the hydrophilicity of image areas and non-image areas be sufficiently large so that when an ink and water are fed to the printing plate surface, the image areas may receive a sufficient amount of the ink and the non-image areas may receive entirely no ink.

Photographic materials comprising a spectrally sensitizable silver halide emulsion of high sensitivity are suitable for the automatic printing plate making and are actually in use in several forms. Representatives of the methods for preparing lithographic printing plates by utilizing photosensitive silver halide emulsions are as follows:

(1) A method by utilizing the tanning development, in which the imagewise exposed hydrophilic gelatino-silver halide emulsion layer is subjected to tanning development to harden the gelatin of image areas, whereby the image areas are converted into a lipophilic ink-receptive pattern (U.S. Pat. No. 3,146,104).

(2) A method of preparing a printing plate, in which a metallic silver pattern formed on the exterior surface by the silver diffusion transfer technique is converted into a lipophilic ink-receptive pattern [U.S. Pat. Nos. 3,721,559 and 3,490,905; Japanese Patent Publication Nos. 16,725/73 and 30,562/73; Japanese Patent Application "Kokai" (Laid-open) No. 21,602/78; A. Rott and L. Dehoes, Journal of Photographic Science, 8, 26–32 (1960)].

(3) A method for preparing a lithographic printing plate by utilizing the etching bleach, in which the developed silver image areas or the areas of silver image formed by the transfer development are treated with a bleaching solution and, at the same time, the gelatin in the silver pattern areas is destroyed to expose the lipophilic surface (U.S. Pat. Nos. 3,385,701 and 3,814,603; Japanese Patent Publication No. 27,242/69).

(4) A method in which the undeveloped silver halide image areas in the developed hydrophilic gelatino-silver halide emulsion layer are selectively converted into a lipophilic ink-receptive pattern [U.S. Pat. Nos. 3,454,398, 3,764,323 and 3,099,209; Japanese Patent Application "Kokai" (Laid-open) No. 9,603/78].

As is well known, the matrix material used in the silver halide emulsion layer for lithographic printing plates is mostly gelatin. It is also known that an undercoat layer comprising gelatin as a hydrophilic polymer is provided on the support, as disclosed in Japanese Patent Application "Kokai" (Laid-open) Nos. 5,503/73, 100,203/73, 55,402/74, 21,602/78 and 9,603/78.

The gelatin-containing layer of the lithographic printing plate is generally hardened with a hardener such as formaldehyde to increase mechanical resistances of the printing plate for the purpose of ensuring a high printing endurance. The degree of hardening of the gelatin-containing layer is one of the important factors affecting the quality of lithographic printing plates. If the hardening is insufficient, the layer tends to be detached from the support during the printing operation, whereas if the layer is excessively hardened, there will occur scumming as well as blinding in the image areas, particularly where fine lines are involved, thus causing a reduction in the printing endurance. The causes for the occurrence of scumming and blinding in the latter case are yet to be elucidated, but seem to be originated in the reduced water retention or the change in development characteristics (such as characteristics of the transferred silver to be rendered ink-receptive in the diffusion transfer method for printing plate making). Therefore, there has been a strong desire among the concerned circles to develop a lithographic printing plate having a high printing endurance and free of scumming or blinding, which printing plate is capable of maintaining its degree of hardening always at a level optimum for the plate not only during its manufacture but also for a long period of time from its manufacture through its processing by the consumer into a printing plate.

SUMMARY OF THE INVENTION

The primary object of this invention is to provide the long-awaited lithographic printing plate as mentioned above and a process for preparing same.

Other objects and advantages of the present invention will become apparent from the following description.

DESCRIPTION OF THE INVENTION AND PREFERRED EMBODIMENTS

The present inventors found that by the use of at least photographic gelatin and a low molecular-weight gelatin in the gelatin-containing layer of a lithographic printing plate, it is possible to obtain a lithographic printing plate of high printing endurance which retains a high hardening level of photographic gelatin and is free from scumming or blinding under varied manufacturing conditions (such as varied drying conditions or varied heating conditions) or after long-term storage.

Gelatin is supplied in various forms such as alkali-treated gelatin, acid-treated gelatin, and gelatin derivatives manufactured by treating or reforming gelatin in various ways. Such gelatins generally have an average molecular weight of from several tens of thousands to a hundred thousand and several tens of thousands, as determined by terminal group analysis, amino acid composition analysis, light scattering, gel permeation, ultracentrifuging, or surface pressure measurement.

As known well, the gelatin-containing layer is laid by utilizing the phenomenon of gelation which takes place after a gelatin coating solution is applied (this phenomenon is called setting of gelatin). The gelation of gelatin is said to be observed when the average molecular weight is greater than about 30,000. The gelatin which is customarily used in photography has an average molecular weight of 100,000 or thereabout, generally from about 70,000 to about 150,000. The term "photographic gelatin" as used herein means a gelatin having sufficient setting characteristics which is customarily used in photography. A gelatin having an average molecular weight below about 30,000 is not generally used in photography, because it shows no or, if any, a feeble gelation tendency and a coating solution containing such a gelatin alone difficultly forms a good photographic layer. The term "low molecular-weight gelatin" as used herein means such a gelatin as noted above, which is different from the customarily used photographic gelatin. The average molecular weight of the low molecular-weight gelatin is generally in the range of from about 3,000 to about 30,000, preferably from about 5,000 to about 20,000. A photographic gelatin naturally contains some low molecular-weight gelatin but it is different from the low molecular-weight gelatin used according to this invention.

According to this invention, the low molecular-weight gelatin is used in an amount of about 3 to about 30 parts by weight for 100 parts by weight of a photographic gelatin. If it is used in excess, there is a danger of unsuccessful formation of a gelatin-containing layer and reduced printing endurance of the lithographic printing plate. The low molecular-weight gelatin is prepared, for example, by the enzymatic decomposition of a common photographic gelatin.

The gelatin-containing layer according to this invention is preferably an undercoating layer but can be any of the layers constituting the lithographic printing plate, such as a silver halide emulsion layer, an intermediate layer, and a physical development nuclei layer.

The photographic gelatin in the gelatin-containing layer can be partly replaced by one or more hydrophilic polymeric binders such as starch, albumin, sodium alginate, hydroxyethylcellulose, gum arabic, polyvinyl alcohol, polyvinyl pyrrolidone, carboxymethylcellulose, polyacrylamide, styrene-maleic anhydride copolymers, and polyvinyl methyl ether-maleic anhydride copolymers. It is also possible to use an aqueous suspension (latex) of a vinyl polymer.

The undercoating is applied at a coverage of generally 0.5 to 10, preferably 1 to 6 g/m$^2$ in terms of polymeric binder and may contain pigments or dyes to prevent halation. The undercoating may be those described in Japanese Patent Application "Kokai" (Laid-open) Nos. 5,503/73, 100,203/73, and 16,507/74. The silver halide emulsion layer may be any of those known as photographic materials. A preferred silver halide emulsion is that described in Japanese Patent Application "Kokai" (Laid-open) No. 55,402/74. An especially preferable combination of gelatins in the undercoating layer was found to be that of an acid-treated gelatin for use as photographic gelatin and a low molecular-weight gelatin, as shown later in Examples.

The hardener for use in the gelatin-containing layer according to this invention is subject to no restriction with respect to the type and the amount to be used. Examples of known gelatin hardeners include aldehydes such as formaldehyde, glyoxal, and glutaraldehyde; compounds related to aldehydes such as mucochloric acid and 2,3-dihydroxy-1,4-dioxane; 6-membered nitrogen-containing heterocyclic compounds having 2 or more active halogen atoms, compounds having a vinylsulfone group, compounds having an ethyleneimino or epoxy group, compounds having a N-methylol group, chrome alum, and dialdehyde starch which is a polymeric hardener. These are used each alone or in combinations.

The supports may be any of the known ones such as polyethylene-coated paper, polypropylene film, polyester film, and aluminum sheet. These supports are generally subjected on the surface to hydrophilizing treatment such as subbing treatment, corona discharge treatment, or the like. The support may be incorporated with pigments or dyes to prevent halation. The present invention is more effectively adaptable to a lithographic printing plate with a plastic film support which is more liable to scumming or blinding as compared with a moisture-permeable support such as polyethylene-coated paper.

The photosensitive material for making a lithographic printing plate according to this invention, after the imagewise exposure, is treated generally with an alkaline developer and successively with the necessary processing solutions for the printing plate making and for the printing, such as neutralizing solution, fixing solution, etch solution, and fountain solution. As the developer, use may be made of any type such as a common photographic alkaline developer containing a developing agent such as hydroquinone, a developer containing sodium thiosulfate for use in silver diffusion transfer technique, and highly alkaline activator solutions derived therefrom.

In the case where the diffusion transfer development is to be performed by using an activator solution containing substantially no developing agent, the developing agent such as hydroquinone, 1-phenyl-3-pyrazolidone, or the like is contained in at least one of the undercoating layer, silver halide emulsion layer, physical development nuclei layer, and the like. A particularly desirable result may be obtained when the gelatin-containing layer according to this invention is adapted to said layers. The contrast between the lipophilicity of image areas and the hydrophilicity of non-image areas may be enhanced by the addition to the developer of an organic compound having a mercapto group or a thione group or a compound having a sulfur-containing heterocyclic group, which improves the ink-receptivity of image areas as described in Japanese Patent Publication No. 486/76 and Japanese Patent Application "Kokai" (Laid-open) No. 150,105/77.

The formulation of a neutralizing, fixing, desensitizing, etching, or dampening solution in accordance with the purpose of use or the type of printing plate material is well known to those skilled in the art. In general, it is desirable to modify the activity of a treating solution by admixing with conventionally known substances such as organic mercapto compounds, desensitization promoters, buffers, preservatives, and wetting agents. Examples of such substances include gum arabic, carboxymethylcellulose, sodium alginate, polyvinylpyrrolidone, polyvinylimidazole, polyvinyl methyl ether-maleic anhydride copolymers, carboxymethylstarch, ammonium alginate, methylcellulose, inorganic sulfates (e.g. sodium sulfate and ammonium sulfate); phosphoric acid, nitric acid, zinc acid, tannic acid, and salts of these acids, polyols having 2 or more hydroxyl groups (e.g. polyethylene glycol, ethylene glycol, propylene glycol, glycerol, diethylene glycol, and hexylene glycol), weak organic acids (e.g. citric acid, succinic acid, tartaric acid, adipic acid, ascorbic acid, and propionic acid), polyacrylic acid, ammonium bichromate, chrome alum, propylene glycol ester of alginic acid, aminopolycarboxylic acid salts (e.g. sodium ethylenediaminetetraacetate), and surface active agents. By the addition of one or more of these substances, it is possible to obtain a processing solution for printing plate making or for printing, which is more suitable for achieving the objects of this invention. It is also possible to add water-miscible organic solvents such as methanol, dimethylformamide, and dioxane, and coloring agents such as phthalocyanine dyes, Malachite Green, and ultramarine for the purpose of identifying the processing solution or of improving its appearance.

The invention is illustrated below with reference to Examples.

EXAMPLE 1

On one side of a polyethylene coated (on both sides) paper sheet, 135 g/m², was provided a matting layer containing silica particles of 5μ in average size. On the opposite side, which had been subjected to corona discharge treatment, was provided an antihalation layer containing silica particles of 5μ in average size, carbon black, and 4.0 g/m² of lime-treated gelatin A having an average molecular weight of about 100,000 (printing plate A) or an antihalation layer containing silica particles of the identical size, carbon black, and 4.0 g/m² of a mixture (9:1) of lime-treated gelatin A and lime-treated gelatin B having an average molecular weight of about 10,000 (printing plate B). An orthochromatically sensitized high-contrast silver chlorobromide emulsion containing silica particles of 5μ in average size was coated, at a coverage of 1.0 g/m² in terms of silver nitrate, on the antihalation layer. Both the antihalation layer and the emulsion layer contained formaldehyde as hardner. After drying, the coated paper sheet was kept at 40° C. for 3 days. A palladium sulfide sol prepared in the following manner was then coated on the emulsion layer at a coating speed of 5 m/minute.

Preparation of palladium sulfide sol:

| Solution A | PdCl$_2$ | 5 g |
|---|---|---|
| | HCl | 40 ml |
| | Water | 1 liter |
| Solution B | Na$_2$S | 8.6 g |
| | Water | 1 liter |

Solutions A and B were mixed with stirring and after 30 minutes the resulting mixture was purified by passing through a column packed with an ionexchanger resin for purifying water. The purified mixture was mixed with solution C to prepare the coating solution.

| Solution C | Polyvinyl methyl ether-maleic anhydride copolymer (1.25%) | 100 ml |
|---|---|---|
| | 10% aqueous saponin solution | 200 ml |
| | Water | 18,000 ml |

After coating of said palladium sulfide sol, the printing plates A and B were heated at 40° C. for 3 days (A-1 and B-1) and for 7 days (A-2 and B-2). The photographic material for the lithographic printing plate obtained as described above was imagewise exposed in a letterpress camera provided with an image reversal mechanism and developed with a silver complex diffusion transfer developer of the following composition at 30° C. for 60 seconds.

| Transfer developer: | |
|---|---|
| Water | 1,500 ml |
| Sodium hydroxide | 20 g |
| Anhydrous sodium sulfite | 100 g |
| Hydroquinone | 16 g |
| 1-Phenyl-3-pyrazolidone | 1 g |
| Sodium thiosulfate | 16 g |
| Potassium bromide | 3 g |
| 1-Ethyl-2-mercaptobenzoimidazole | 0.05 g |
| 3-Mercapto-4-acetamido-5-n-heptyl-1,2,4-triazole | 0.1 g |
| Make up with water to | 2 liters |

After developing, the photographic material was passed through a pair of squeeze rollers to remove the excess developer, then treated with the following neutralizer, and dried at ambient temperature and humidity.

| Neutralizer: | |
|---|---|
| Water | 600 ml |
| Ethylene glycol | 5 g |
| Citric acid | 10 g |
| Sodium citrate | 35 g |
| Made up with water to | 1 liter |

The lithographic printing plate prepared as described above was mounted on an offset press, then fed with the following etch solution all over the surface, and the press was run using the following fountain solution.

| Etch solution: | |
|---|---|
| Water | 600 ml |
| Isopropyl alcohol | 400 ml |
| Ethylene glycol | 50 g |
| 3-Mercapto-4-acetamido-5-n-heptyl-1, 2, 4-triazole | 1 g |

Fountain solution (before use, diluted 10-fold with water):

| | |
|---|---|
| Water | 880 ml |
| Citric acid | 6 g |
| Boric acid | 8.4 g |
| Sodium sulfate | 25 g |
| Cobalt chloride | 2.5 g |
| Ethylene glycol | 100 g |

The printing press employed was A. B. Dick 350 CD (an offset press; Trademark for A. B. Dick Co.).

Printing was continued with F gloss "kon-ai" ink and the scumming and blinding were evaluated in terms of the number of copies obtained before the occurrence of ink-staining (scumming) in non-image areas and blinding of image areas, respectively. The rating was as follows:

x: 3,000 copies or less
Δ: 5,000 copies or less
o: More than 5,000 copies

| Designation of printing plate | Time of heating for hardening (day) |
|---|---|
| A-1 and B-1 | 3 |
| A-2 and B-2 | 7 |

The results obtained were as shown in Table 1.

TABLE 1

| Printing plate | Scumming | Blinding |
| --- | --- | --- |
| A-1 | Δ | o |
| A-2 | x | Δ |
| B-1 | o | o |
| B-2 | o | o |

Although no problem was presented at a hardening level attained by heating for 3 days, the conventional lithographic printing plate A hardened by heating for 7 days revealed the defects of scumming and blinding, whereas the lithographic printing plate B of this invention showed none of such defects at a hardening level attained by heating for 7 days, indicating a high printing endurance.

EXAMPLE 2

The procedure of Example 1 was repeated, except that the support was photographic polyester film base (100μ) and the photographic gelatin used in the undercoating layer was acid-treated gelatin C having a jelly strength of 300 g and a molecular weight of about 100,000 in place of the photographic gelatin A.

| Designation of printing plate | Time of heating for hardening (day) |
| --- | --- |
| C-1 and D-1 | 3 |
| C-2 and D-2 | 7 |

In printing plate C (control), gelatin C was used, while in printing plate D, a combination of gelatin C and gelatin B was used.

The results obtained were as shown in Table 2.

TABLE 2

| Printing plate | Scumming | Blinding |
| --- | --- | --- |
| C-1 | x | Δ |
| C-2 | x | x |
| D-1 | o | o |
| D-2 | o | o |

EXAMPLE 3

A lithographic printing plate was prepared in the same manner as in Example 1, except that the antihalation layer contained 0.2 g/m² of 1-phenyl-3-pyrazolidone, the palladium sulfide nuclei layer contained 0.5 g/m² of hydroquinone, and the polyvinyl methyl ehter-maleic anhydride copolymer in nuclei coating composition was replaced by polymer No. 3 (1 g) described in Japanese Patent Application "Kokai" (Laid-open) No. 21,602/78 (U.S. Pat. No. 4,160,670). The transfer developer was of the following composition.

| Transfer developer: | | |
| --- | --- | --- |
| Water | 750 | ml |
| Potassium hydroxide | 20 | g |
| Sodium sulfite, anhydrous | 60 | g |
| Potassium bromide | 0.5 | g |
| 2-Mercaptobenzoic acid | 10 | mmol |
| 2-Methyl-2-amino-1-propanol | 10 | g |
| Made up with water to | 1 | liter |

The test was performed in the same manner as in Example 1. The results obtained were as shown in Table 3.

| Designation of printing plate | Time of heating for hardening (day) |
| --- | --- |
| E-1 (control) | 3 |
| F-1 (this invention) | 3 |
| E-2 (control) | 7 |
| F-2 (this invention) | 7 |

Rating:
x: 5,000 copies or less
Δ: 8,000 copies or less
o: More than 8,000 copies

TABLE 3

| Printing plate | Scumming | Blinding |
| --- | --- | --- |
| E-1 | Δ | o |
| E-2 | x | Δ |
| F-1 | o | o |
| F-2 | o | o |

EXAMPLE 4

A lithographic printing plate was prepared by following the description in Example 1 of Japanese Patent Application "Kokai" (Laid-open) No. 9,603/78 (U.S. Pat. No. 4,230,792).

An undercoating layer containing silica particles, 5μ in average size, and carbon black was provided on a polyethylene-coated paper sheet. This undercoating layer contained 2 g/m² of gelatin A used in Example 1 and was hardened with formaldehyde and dimethylolurea. The same silver emulsion layer as used in Example 1 was provided on the coating layer. This emulsion layer was also hardened with formaldehyde and dimethylolurea (reference printing plate G).

In a manner similar to that described above, a printing plate H (according to this invention) was prepared, in which 15% by weight of gelatin A in the undercoating layer of reference printing plate G had been replaced by gelatin D having an average molecular weight of about 15,000. Another printing plate I (according to this invention) was prepared, in which 5% by weight of the photographic gelatin in the emulsion layer of printing plate H had been replaced by gelatin D.

The printing plates thus obtained were heated at 40° C. for 2 and 6 days. Each printing plate was imagewise exposed, developed in D-72 developer at 25° C. for 30 seconds, removed of the excess developer by squeezing, immersed in a conversion solution of the following composition at 25° C. for 30 seconds, then squeezed, and dried to obtain an imaged printing plate ready for printing.

| Water | 600 | ml |
| --- | --- | --- |
| Potassium thiocyanate | 20 | g |
| Citric acid | 10 | g |
| Sodium citrate | 35 | g |
| 2-Mercapto-5-propyl-1,3,5-oxa-diazole | 1 | g |
| Isopropyl alcohol | 200 | ml |
| Made up with water to | 1 | liter |

The printing test was performed in the same manner as in Example 1. When hardened by heating for 2 or 6 days, the printing plates H and I of this invention showed neither scumming nor blinding before 5,000 copies had been printed. As contrasted, the reference printing plate hardened by heating for 6 days showed scumming when about 2,000 copies had been printed.

According to this invention, there is provided a printing plate of high printing endurance which shows no change in printing characteristics even after long-term storage.

What is claimed is:

1. A lithographic printing plate which uses silver or silver halide image as ink receptive area and which has at least one hardened gelatin-containing layer on a support, wherein at least one of the gelatin-containing layers contains a composition including a gelatin resulting from mixing a photographic gelatin having an average molecular weight of about 70,000 to about 150,000 and a low molecular weight gelatin having an average molecular weight of about 3,000 to about 30,000, said low molecular weight gelatin being contained in an amount of about 3 to 30 parts by weight for 100 parts by weight of the photographic gelatin and said layer containing the photographic gelatin and the low molecular weight gelatin being hardened.

2. A lithographic printing plate according to claim 1 containing an undercoating layer, a silver halide emulsion layer, an intermediate layer and a physical development nuclei layer and wherein the gelatin-containing layer containing the photographic gelatin and the low molecular-weight gelatin is one of the undercoating layer, silver halide emulsion layer, intermediate layer, and physical development nuclei layer.

3. A lithographic printing plate according to claim 1 containing an undercoating layer and wherein the gelatin-containing layer containing the photographic gelatin and the low molecular-weight gelatin is the undercoating layer.

4. A lithographic printing plate according to claim 3, wherein the photographic gelatin is an acid-treated gelatin.

5. A lithographic printing plate according to claim 1 which is made by silver complex diffusion transfer process.

6. A lithographic printing plate according to claim 1, wherein the gelatin-containing layer is hardened with aldehyde hardeners.

7. A method for making a lithographic printing plate which comprises imagewise exposing a photosensitive material which has at least one hardened gelatin-containing layer on a support, wherein at least one of the gelatin-containing layers contains a composition including a gelatin resulting from mixing a photographic gelatin having an average molecular weight of about 70,000 to about 150,000 and a low molecular weight gelatin having an average molecular weight of about 3,000 to about 30,000, said low molecular weight gelatin being contained in an amount of about 3 to 30 parts by weight for 100 parts by weight of the photographic gelatin and said layers containing the photographic gelatin and the low molecular weight gelatin being hardened and then developing thus exposed material.

8. A method for printing with a lithographic printing plate which uses silver or silver halide image as ink receptive area and which has at least one hardened gelatin-containing layer on a support, wherein at least one of the gelatin-containing layers contains a composition including a gelatin resulting from mixing a photographic gelatin having an average molecular weight of about 70,000 to 150,000 and a low molecular weight gelatin having an average molecular weight of about 3,000 to about 30,000, said low molecular weight gelatin being contained in an amount of about 3 to 30 parts by weight for 100 parts by weight of the photographic gelatin and said layer containing the photographic gelatin and the low molecular weight being hardened, said process comprising applying a fountain solution to said lithographic printing plate, inking said printing plate and printing with said printing plate.

* * * * *